United States Patent [19]

Nakano et al.

[11] 4,392,211

[45] Jul. 5, 1983

[54] SEMICONDUCTOR MEMORY DEVICE TECHNICAL FIELD

[75] Inventors: Masao Nakano, Kawasaki; Fumio Baba, Yokohama; Tomio Nakano, Kawasaki; Yoshihiro Takemae, Yokohama; Hirohiko Mochizuki, Tokyo, all of Japan

[73] Assignee: Fujitsu Limited, Kawasaki, Japan

[21] Appl. No.: 243,927

[22] PCT Filed: Jun. 24, 1980

[86] PCT No.: PCT/JP80/00143

§ 371 Date: Feb. 25, 1981

§ 102(e) Date: Feb. 20, 1981

[87] PCT Pub. No.: WO81/00027

PCT Pub. Date: Jan. 8, 1981

[30] Foreign Application Priority Data

Jun. 25, 1979 [JP] Japan .................. 54-79819

[51] Int. Cl.$^3$ .............................................. G11C 7/00
[52] U.S. Cl. .................................................. 365/200
[58] Field of Search .................... 365/200; 371/10, 11, 371/21

[56] References Cited

U.S. PATENT DOCUMENTS 3,753,244  8/1973  Sumilas et al. ............... 365/200
4,047,163  9/1977  Choate et al. ................. 365/200
4,365,319  12/1982 Takemae ........................ 365/200

FOREIGN PATENT DOCUMENTS 52-61933  5/1977  Japan .

Primary Examiner—Joseph A. Popek
Attorney, Agent, or Firm—Staas & Halsey

[57] ABSTRACT

A semiconductor memory device wherein a redundancy memory cell array incorporated with main memory cell matrixes is disclosed. Memory cells of the main memory cell matrixes are selected by first and third decoders while memory cells of the redundancy memory cell array are selected by second and third decoders. When the redundancy memory cell array is selected by the second decoder, the transmission of a clock signal to the first decoders is stopped by a switching circuit.

7 Claims, 2 Drawing Figures

SEMICONDUCTOR MEMORY DEVICE

TECHNICAL FIELD

DESCRIPTION

BACKGROUND OF THE INVENTION

The present invention relates to a semiconductor memory device and, more particularly, to a semiconductor memory device including a redundancy memory cell array therein.

A semiconductor memory device comprises a large number of memory cells arranged along rows and columns which are orthogonal to each other. The density of defects generated in such a semiconductor memory device during manufacturing is relatively independent of the integration density of the device, but is dependent on semiconductor manufacturing technology. Therefore, the higher the integration density of the device is, the greater is the ratio of the number of normal memory cells to that of defective momory cells. This is one of the advantages obtained by increasing the integration density of a semiconductor memory device. However, even if the device includes only one defective memory cell therein, the device cannot operate normally, and therefore the device is abandoned.

In order to be able to operate a semiconductor memory device despite such a defective memory cell, a semiconductor memory device has been known in which a redundancy memory cell array is incorporated with a main memory cell matrix along rows or columns thereof. In this device, when a defective memory cell is detected, the redundancy memory cell array is used instead of a row memory cell array or a column memory cell array including said memory cell. In a semiconductor memory device including such a redundancy memory cell array therein, the manufacturing yield thereof can be improved.

One conventional semiconductor memory device including a redundancy memory cell array comprises a connection area for connecting a redundancy memory cell array to one of the row memory cell arrays of a main memory cell matrix. When a row memory cell array having a defective memory cell is detected, the connections between the defective row memory cell array and a row address decoder are cut off and, after that, the redundancy memory cell array is connected to said row decoder by arranging connections in the connection area. However, in this device, such a cutting off and connecting operation is complex, inefficient and expensive.

Another semiconductor memory device including a redundancy memory cell array therein comprises row address decoders (or column address decoders) each of which has a switching circuit for selecting the redundancy memory cell array (Ref.: IEEE Trans. Electron Devices, vol. ED-26, No. 6, pp. 853–860, June 1979). When a defective memory cell is detected in a row memory cell array, a row address decoder selects the redundancy memory cell array instead of said row memory cell array when the decoder receives a row address signal indicating said row memory cell array. It should be noted that the switching circuit is comprised of a programmable read-only memory (which is a so-called PROM) written by laser light or written electrically. However, in this device, the row address decoders should be comprised of the above-mentioned switching circuits whose number is the same as that of the rows of a main memory cell matrix, which necessitates a complex structure.

Still another conventional semiconductor memory device including a redundancy memory cell array comprises means for comparing one part of an address information such as a row address information with a row address indicating a row memory cell array including a defective memory cell, said row address being given from external terminals, and a switching means for preventing said row address information from being supplied to row address decoders when receiving a coincidence signal generated from the comparing means (Ref. Japanese Patent Laid-Open Application No. Sho. 52-61933). The coincidence signal also serves as a signal for selecting the redundancy memory cell array. In this device, instead of providing the above-mentioned PROM for storing a row address of a defective row memory array, said row address is represented by a combination of connections between the external terminals and two kinds of power supply lines. However, in this device, the number of above-mentioned external terminals must be equal to the number of row address lines, and therefore, the chip size of the device cannot be reduced. In addition, the switching means for suppressing the row address information requires switching elements which are also equal in number to the row address lines, so that the device is complex in structure. Further, the row address lines are switched directly by the switching means so that the row address signals appearing in the row address lines may be confused which may cause a malfunction of the row address decoders.

SUMMARY OF THE INVENTION

It is an object of the present invention to provide a semiconductor memory device including a redundancy memory cell array which is simple in structure, has a small number of external terminals, and is efficient in addressing the redundancy memory cell array and, in addition, can prevent decoders from malfunctioning.

According to the present invention, there is provided a semiconductor memory device comprising: a main memory cell matrix; a redundancy memory cell array which is incorporated with said main memory cell matrix; a first decoder means for selecting one memory cell array parallel to said redundancy memory cell array within said main memory cell matrix, in accordance with a first address information; a second decoder means for selecting said redundancy memory cell array, in accordance with said first address information; a switching means for stopping the transmission of a clock signal for operating said first decoder means thereto, and; a third decoder means for selecting one memory cell array perpendicular to said redundancy memory cell array, within said main cell matrix and said redundancy memory cell array, in accordance with a second address information. In this device, when the redundancy memory cell array is selected by the second decoder means, the first decoder means is not operated and, accordingly, the first decoder means does not select a memory cell array even when the first decoder means receives the first address information.

The present invention will be more clearly understood from the description as set forth below with reference to the accompanying drawings.

DESCRIPTION OF THE PREFERRED EMBODIMENT

Figure 1:
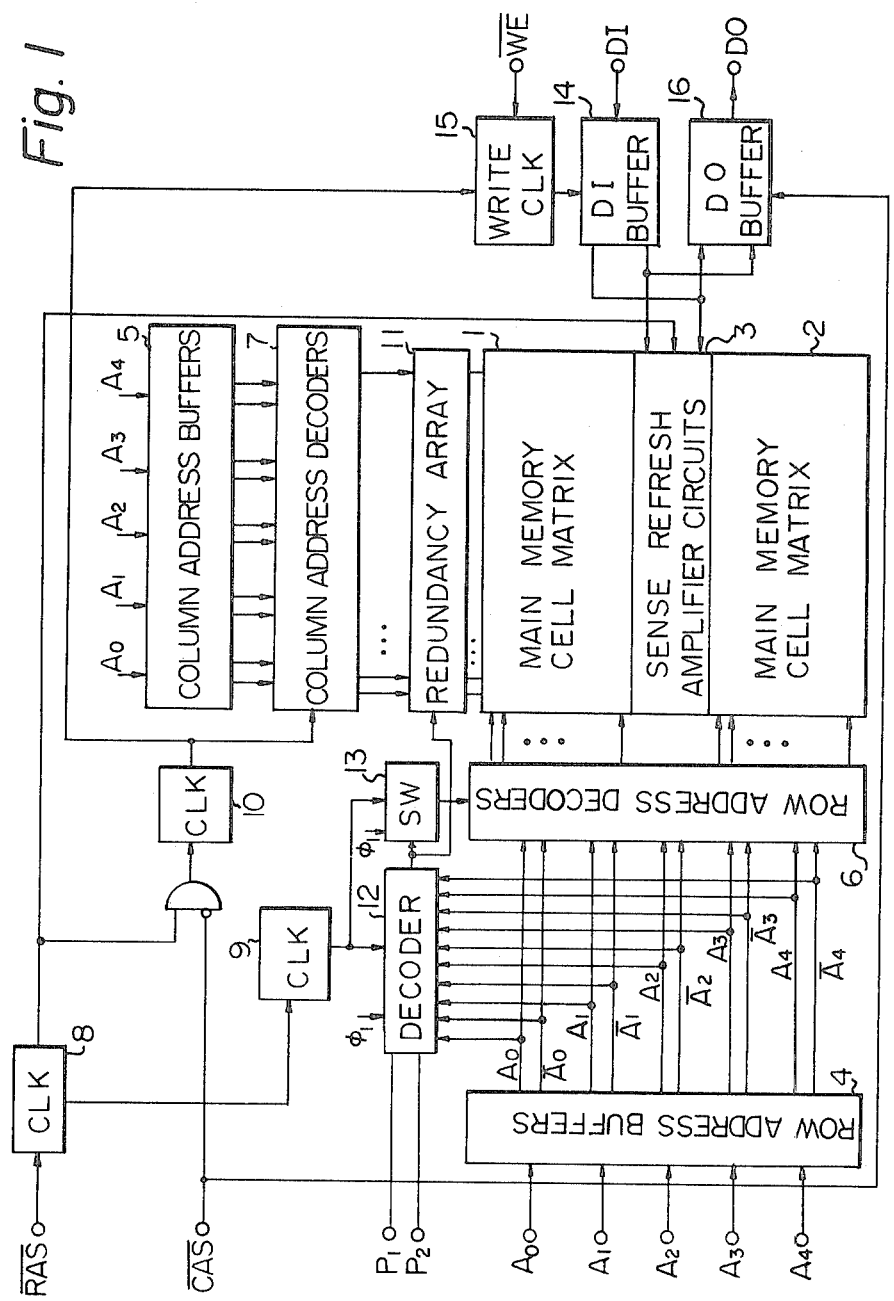
FIG. 1 is a block diagram illustrating an embodiment of the semiconductor memory device according to the present invention.

Referring to FIG. 1, which illustrates a semiconductor memory device such as 1024 ($=2^{10}$) bit dynamic MOS RAM (which is an abbreviation of random access memory) or ROM according to the present invention, the device comprises two main memory matrixes 1 and 2 each of which is comprised of 512 memory cells, and sense and refresh amplifier circuit 3 for sensing and refreshing the memory cells arranged between the two main memory cell matrixes 1 and 2. However, it should be noted that the two matrixes 1 and 2 operate as one matrix. In addition, the device comprises row address buffers 4 and column address buffers 5 for converting TTL level address signals $A_0, A_1, \ldots, A_4$ into MOS level address signals $A_0, A_1 \ldots, A_4$, and their inverted signals $\bar{A}_0, \bar{A}_1, \ldots, \bar{A}_4$, row address decoders 6 for decoding row address signals $A_0, \bar{A}_0, A_1, \bar{A}_1, \ldots, A_4, \bar{A}_4$ from the row address buffers 4 so as to select one row of the main memory cell matrixes 1 and 2, and column address decoders 7 for decoding column address signals $A_0, \bar{A}_0, A_1, \bar{A}_1, \ldots A_4, \bar{A}_4$ from the column address buffers 5 so as to select one column of the main memory cell matrixes 1 and 2. In the device, such address signals $A_0, A_1, \ldots, A_4$ of TTL level are twice suppllied to the device for one access thereto. Among them, a first group of the signals are used for selecting one row of the main memory cell matrixes 1 and 2, while a second group of the signals are used for selecting one column of the main memory cell matrixes 1 and 2. Such time-divisional control of the address signals is effected by three clock generators, i.e., a clock generator 8 which receives an inverted row address strobe signal $\overline{RAS}$ and, in turn, generates internal clock signals, a clock generator 9 which receives one internal clock signal of the clock generator 8 and, in turn, generates another internal clock signal, and a clock generator 10 which receives one internal clock of the clock generator 8 and a column address strobe signal $\overline{CAS}$ and, in turn, generates another internal clock signal.

In addition, the above-mentioned device comprises a redundancy memory cell array 11 which is incorporated with the main memory cell matrix 1 and corresponds to one row of the main memory cell matrixes 1 and 2, an additional decoder 12 for selecting the redundancy memory cell array 11, and a switching circuit 13 for stopping the transmission of a clock signal from the clock generator 9 to the row address decoders 6 when receiving a selection signal generated from the decoder 12. Said selection signal is used for selecting the redundancy memory cell array 11. The decoder 12 is comprised of a fuse-typed PROM. If a defective memory cell is detected in the main memory cell matrix 1 or 2, the row address to which said defective memory cell belongs is written in the PROM. Of course, when the main memory cell matrixes 1 and 2 include no defective memory cell, the decoder 12 does not execute the selection operation for the redundancy memory cell array 11.

Reference numeral 14 indicates a data input buffer, for input data DI, which is controlled by a write clock generator 15 which receives an inverted write-enable signal $\overline{WE}$. In addition, reference numeral 16 indicates a data output buffer for output data DO. Both buffers are connected to two data bit lines (not shown) within the sense and refresh amplifiers 3. Further, terminals $P_1$ and $P_2$ are used for writing the defective row address to the decoder 12.

In the present invention, due to the presence of the redundancy memory cell array 11, only the decoder 12 and the switching circuit 13 are added to a conventional semiconductor memory device that includes no redundancy memory cell. Therefore, the parts of said conventional device, such as address buffers, address decoders or clock generators, may be used in the device according to the present invention without changing the design thereof.

The operation of the device of FIG. 1 will be now explained.

Usually, all memory cells of the main memory cell matrixes 1 and 2 of a completed semiconductor memory device are tested. After testing, if all of the memory cells of the main memory matrixes 1 and 2 are determined to be normal, the operation of the device is the same as that of a conventional memory device without the redundancy memory cell array 11, the decoder 12 and the switching circuit 13. In this case, one row array is selected from the main memory cell matrixes 1 and 2 by the row address decoder 6 and, after that, one column array is selected from the main memory cell matrixes 1 and 2 by the column address decoder 7, so that one desired memory cell at the intersection of said one row array and one column is selected. Next, the data stored in the desired memory cell is read out to the data output buffer 16, or new data from the data input buffer 14 is written into the desired memory cell.

However, if one or more defective memory cells is detected in one row memory array of the main memory cell matrixes 1 and 2, the row address (hereinafter referred to as a defective row address $ADD_x$) of the defective row is written into the decoder 12 (which operates as a fuse-type PROM) by using output signals $A_1, \bar{A}_1, \ldots, A_4, \bar{A}_4$ of the row address buffers 4. As a result, the decoding operation for the signals $A_0, \bar{A}_0, A_1, \bar{A}_1, \ldots A_4, \bar{A}_4$ of the row address buffers 4 is effected by either the row address decoders 6 or the decoder 12. For example, when the signals $A_0, \bar{A}_0 A_1, \bar{A}_1, \ldots, A_4, \bar{A}_4$ do not correspond to the defective row address $ADD_x$, the decoder 12 does not operate, while the row address decoders 6 operate so as to select one row array among the main memory cell matrixes 1 and 2. After that, the column address decoders 7 operate so as to select one column array of the main memory cell matrixes 1 and 2. As a result, one normal memory cell of the main memory cell matrixes 1 and 2 is selected. Contrary to this, if the signals $A_0, \bar{A}_0, A_1, \bar{A}_1, \ldots, A_4, \bar{A}_4$ correspond to the defective row address $ADD_x$, the decoder 12 operates so as to select the redundancy memory cell array 11 and, accordingly, any of the memory cells of the array 11 can be selected. Simultaneously, the decoder 12 disables the switching circuit 13 so as to stop the transmission of the clock signal of the clock generator 9 to the row address decoders 6. As a result, the row address decoders 6 cannot be operated during the stand-by time and, accordingly, the decoders 6 cannot select a row array even when the decoders 6 receive the signals $A_0, \bar{A}_0, A_1, \bar{A}_1, \ldots, A_4, \bar{A}_4$ from the row address buffers 4. After that, the column address decoders 7 operate so as to select one memory cell of the redundancy memory cell array 11.

Figure 2:
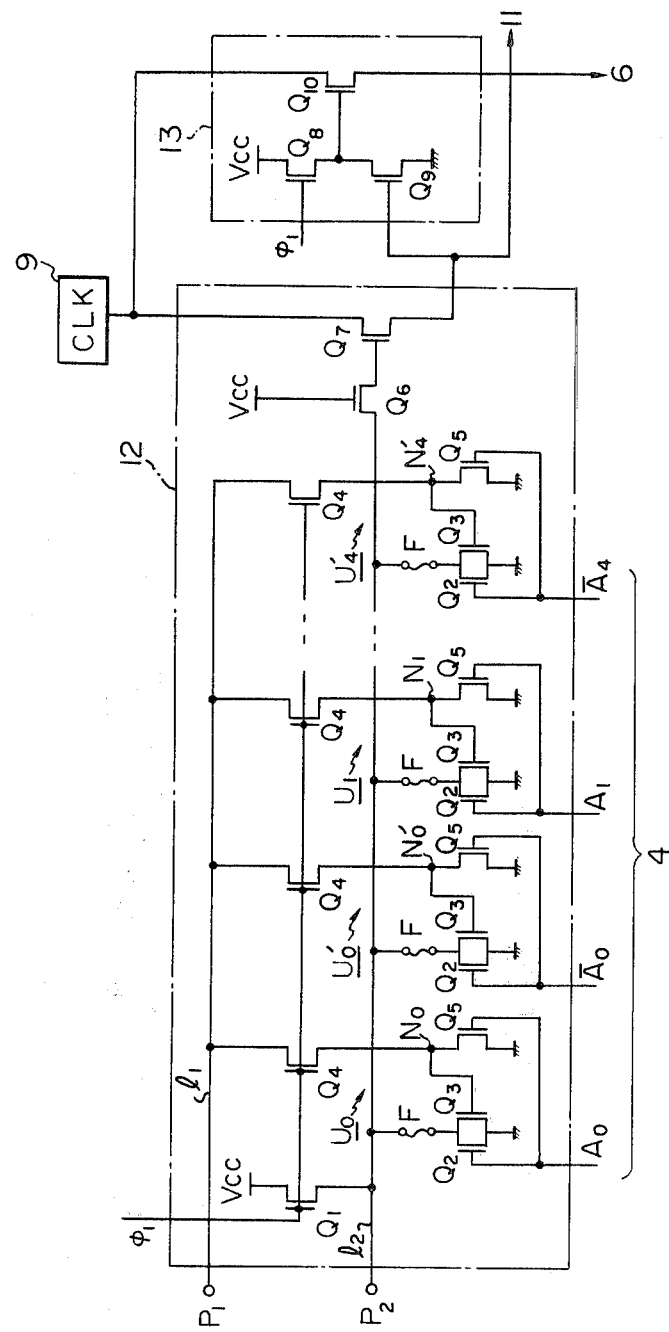
FIG. 2 is a circuit diagram of a decoder 12 for selecting a redundancy memory cell array and a switching circuit 13 of FIG. 1.

FIG. 2 is a circuit diagram of the decoder 12 for selecting the redundancy memory cell array 11 and the switching circuit 13 of FIG. 1. In FIG. 2, $Q_1$ is a transistor for controlling a line $l_2$ connected to the program terminal $P_2$ in response to a clock signal $\phi_1$. $Q_2$ is a transistor which is connected between the line $l_2$ via a fuse F and the ground. The transistor $Q_2$ is an element necessary for the operation of the decoder 12, if the fuse F is not melted down. A transistor $Q_3$ is connected in parallel to the transistor $Q_2$ and transistors $Q_4$ and $Q_5$, control the gate voltage of the transistor $Q_3$. transistors $Q_4$ and $Q_5$ are connected in series between a line $l_1$ connected to program terminal $P_1$ and the ground. Transistors $Q_3$, $Q_4$, and $Q_5$ are elements for writing in the decoder 12 in order to use it as a PROM, in other words, for melting down the fuse F. However, these three transistors $Q_3$, $Q_4$ and $Q_5$ are unnecessary for the operation of the decoder 12. Circuit units $U_0$, $U_0'$, $U_1$, . . ., $U_4'$, each of which is comprised of the fuse F and the transistors $Q_2$, $Q_3$, $Q_4$ and $Q_5$, are used for receiving the signals $A_0$, $\overline{A}_0$, $A_1$, . . . , $\overline{A}_4$ from the row address buffers 4, respectively. The potential of the line $l_2$ is applied to the gate of a transistor $Q_7$ via a transistor $Q_6$ which serves as a transfer gate, so that the transistor $Q_7$ is controlled by the potential. The switching circuit 13 comprises transistors $Q_8$ and $Q_9$ connected in series which together serve as an inverter, and a transistor $Q_{10}$ is controlled by the output of the inverter. For example, if the transistor $Q_7$ of the decoder 12 is conductive, the transistor $Q_9$ is also conductive, and the transistor $Q_{10}$ is non-conductive. As a result, the clock signal from the clock generator 9 is supplied to the redundancy memory cell array 11 via the transistor $Q_7$, not to the row address decoders 6. Contrary to this, if the transistor $Q_7$ of the decoder 12 is non-conductive, the transistor $Q_9$ is also non-conductive, and the transistor $Q_{10}$ remains non-conductive. As a result, the clock signal from the clock generator 9 is supplied to the row address decoders 6, not to the redundancy memory cell array 11.

The write operation of the defective row address $ADD_x$ for the decoder 12 will now be explained. As a first step, the potential of the clock signal $\phi_1$ (which is in synchronization with the signal RAS and is generated by the clock generator 8 of FIG. 1) is set to be high, so that the transistor $Q_4$ of the circuit units $U_0$, $U_0'$, $U_1$, . . ., $U_4'$ is conductive. In addition, the potential of the line $l_1$, is raised by applying a voltage to the program terminal $P_1$, said voltage being high enough that the potentials of nodes $N_0$, $\overline{N}_0$, $N_1$, . . . , $\overline{N}_4'$ is raised. As a second step, the potential of the clock signal $\phi_1$ is changed from high to low and the signals $A_0$, $\overline{A}_0$, $A_1$, . . . , $\overline{A}_4$ representing the row address $ADD_x$ of a defective memory cell array are supplied from the row address buffers 4 to the circuit units $U_0$, $U_0'$, $U_1$, . . . , $U_4'$, respectively. For example, if the potentials of the signals $A_0$ and $A_1$ are low and the potentials of the signals $\overline{A}_0$ and $\overline{A}_4$ are high, the potentials of the nodes $N_0$ and $N_1$ remain high, so that the transistors $Q_3$ of the circuit units $U_0$ and $U_1$ remain conductive, while the potentials of the nodes $N_0'$ and $N_4'$ are low, so that the transistors $Q_3$ of the circuit units $U_0'$ and $U_4'$ are non-conductive. As a third step, the signals $A_0$, $\overline{A}_0$, $A_1$, . . . , $\overline{A}_4$ are cut off. Even in this state, the transistors $Q_3$ of the circuit units $U_0$ and $U_1$ remain conductive. After that, the potential of the line $l_2$ is raised by applying a voltage to the program terminal $P_2$, said voltage being high enough to cause a large current flow from the line $l_2$ via the fuses F and the transistors $Q_3$ of the circuit units $U_0$ and $U_1$ to the ground and, accordingly, the fuses F of the circuit unit $U_0$ and $U_1$ are melted down. Of course, the fuses F of the circuit units $U_0'$ and $U_4'$ are not melted down. Thus, the write operation of the defective row address $ADD_x$ for the decoder 12 is completed. After this, the program terminal $P_1$ is connected to a $V_{ss}$ terminal (not shown) via a resistor (not shown) of a high resistance, so that, when the potential of the clock signal $\phi_1$ is high, the transistor $Q_3$ cannot be conductive. In addition, the program terminal $P_2$ remains open.

The decoding operation of the decoder 12 will now be explained. First, during a stand-by time, the potential of the clock signal $\phi_1$ is high so that the line $l_2$ is connected to power supply $V_{cc}$. Next, signals $A_0$, $\overline{A}_0$, $A_1$, . . . , $\overline{A}_4$ are supplied from the row address buffers 4 to the decoder 12. If the signals $A_0$, $\overline{A}_0$, $A_1$, . . . , $\overline{A}_4$ correspond to the above-mentioned defective row address $ADD_x$, the transistors $Q_2$ of all the circuit units $U_0$, $U_0'$, $U_1$, . . . , $U_4'$ remain non-conductive and, accordingly, the potential of the line $l_2$ remains high and the transistor $Q_7$ is conductive. As a result, the clock signal from the clock generator 9 is supplied to the redundancy memory cell array 11 via the transistor $Q_7$, not to the row address decoders 6. Contrary to this, if the signals $A_0$, $\overline{A}_0$, $A_1$, . . . , $\overline{A}_4$ do not correspond to the defective row address $ADD_x$, at least one transistor $Q_2$ of the circuit units $U_0$, $U_0'$, $U_1$, . . . , $U_4'$ is conductive, so that the potential of the line $l_2$ is low. As a result, the transistor $Q_7$ is non-conductive, so that the clock signal generated from the clock generator 9 is supplied to the row address decoders 6, not to the redundancy memory cell array 11.

It should be noted that, in FIG. 1, one redundancy memory cell array 11 is incorporated with the main memory matrixes 1 or 2 and, accordingly, in spite of a defective memory cell, the device of FIG. 1 can be used (in particular cases, two or more defective memory cells may occur in one row array; the device of FIG. 1 can thus be used in spite of these defects.). However, in order to save two or more defective memory cells, two or more redundancy memory cell arrays 11 can be provided. In this case, decoders 12 and switching circuits 13 which are equal in number to the redundancy memory cell arrays are necessary. In addition, in FIG. 1, the redundancy memory cell array 11 is incorporated with the main memory cell matrixes 1 and 2 along the rows thereof, but the redundancy memory cell array 11 can also be incorporated with the main memory cell matrixes 1 and 2 along the columns thereof.

As explained hereinbefore, the semiconductor memory device including a redundancy memory cell array therein has the following advantages, as compared with those of the prior art.

(1) The device is simple in structure, since only the decoder 12 and the switching circuit 13 are added to a semiconductor memory device having no redundancy memory array.

(2) Since the decoder 12 is comprised of a PROM connected to the external terminals $P_1$ and $P_2$ (so that externally supplementing for a defective address is unnecessary) and further, since a large number of external terminals therefor is also unnecessary, the addressing of the redundancy memory cell array is efficient.

(3) Since the clock signal for operating the row address decoder 6 is on-off controlled, instead of controlling directly the address signals $A_0, \overline{A}_0, \ldots, \overline{A}_4$, the address signals cannot be confused and, accordingly, a malfunction of the decoders can be prevented.

What is claimed is:

1. A semiconductor memory device comprising:
   a main memory cell matrix;
   a redundancy memory cell array which is incorporated with said main memory cell matrix;
   a first decoder means for selecting one memory cell array parallel to said redundancy memory cell array within said main memory cell matrix, in accordance with a first address information;
   a second decoder means for selecting said redundancy memory cell array when said first address information corresponds to a memory cell array having a defective cell therein;
   a switching means for stopping the transmission of a clock signal for operating said first decoder means when said first address information corresponds to said memory cell array having a defective cell therein and said second decoder means selects said redundancy memory cell array; and
   a third decoder means for selecting one memory cell array perpendicular to said redundancy memory cell array, within said main memory cell matrix and said redundancy memory cell array, in accordance with a second address information.

2. A semiconductor memory device as set forth in claim 1, wherein said redundancy memory cell array is incorporated with said main memory cell matrix as a row array, and said first and second address informations are row and column address information, respectively.

3. A semiconductor memory device as set forth in claim 1, wherein said redundancy memory cell array is incorporated with said main memory maatrix as a column array, and said first and second address informations are column and row address information, respectively.

4. A semiconductor memory device as set forth in claim 1, wherein said second decoder means is comprised of address memory means for storing an address information indicating a memory cell array including a defective memory cell.

5. A semiconductor memory device as set forth in claim 4, wherein said address memory means is comprised of a fuse type read-only memory.

6. A semiconductor memory device as set forth in claim 4, wherein said second decoder means includes coincidence detecting means for detecting a coincidence between the content of said address memory means and said first address information, said switching means being controlled by the output of said coincidence detecting means.

7. A semiconductor memory device as set forth in claim 6, wherein said switching means for stopping the transmission of a clock signal comprises an inverter responsive to the output of the coincidence detecting means and means responsive to the output of the inverter for stopping transmission of the clock signal.

* * * * *

UNITED STATES PATENT AND TRADEMARK OFFICE
CERTIFICATE OF CORRECTION

PATENT NO. : 4,392,211
DATED : July 5, 1983
INVENTOR(S) : Nakano et al

It is certified that error appears in the above-identified patent and that said Letters Patent is hereby corrected as shown below:

[54] Title, delete "TECHNICAL FIELD".

Col. 1, line 21, "momory" should be --memory--;
Col. 1, line 54, "decorders" (both occurrances) should be --decoders--.

Col. 3, line 31, after "..." insert --,--;
line 35, "suppllied" should be --supplied--;
line 47, after "clock" (first occurrance) insert --signal--.

Col. 5, line 13, delete ",";
line 14, "transistors" should be --Transistors--.

Col. 8, line 12, delete "an".

Signed and Sealed this

Twenty-fifth Day of October 1983

[SEAL]

Attest:

GERALD J. MOSSINGHOFF

Attesting Officer   Commissioner of Patents and Trademarks